(12) United States Patent
Fujita et al.

(10) Patent No.: US 7,968,941 B2
(45) Date of Patent: Jun. 28, 2011

(54) SEMICONDUCTOR DEVICE

(75) Inventors: Kazunori Fujita, Yoro-gun (JP); Tomio Yamashita, Ogaki (JP); Haruki Yoneda, Ogaki (JP); Kazuhiro Sasada, Hashima (JP)

(73) Assignee: Sanyo Electric Co., Ltd., Osaka (JP)

( * ) Notice: Subject to any disclaimer, the term of this patent is extended or adjusted under 35 U.S.C. 154(b) by 56 days.

(21) Appl. No.: 12/412,659

(22) Filed: Mar. 27, 2009

(65) Prior Publication Data
US 2009/0242981 A1    Oct. 1, 2009

(30) Foreign Application Priority Data
Mar. 27, 2008    (JP) .................................. 2008-084797

(51) Int. Cl.
*H01L 29/76*    (2006.01)
(52) U.S. Cl. ......... 257/335; 257/330; 257/341; 438/286
(58) Field of Classification Search ................... 257/335, 257/330, 341, E29.256; 438/286
See application file for complete search history.

(56) References Cited

U.S. PATENT DOCUMENTS
2009/0114987 A1 *  5/2009  Tanaka .......................... 257/335

FOREIGN PATENT DOCUMENTS
| CN | 1422442 A | 6/2003 |
| CN | 1755944 A | 4/2006 |
| JP | 10233508 A | 9/1998 |
| JP | 2001513270 A | 8/2001 |

OTHER PUBLICATIONS

Chinese Office Action for corresponding CN Application No. 200910127749.1, dated Aug. 17, 2010, pp. 1-11 China.

* cited by examiner

*Primary Examiner* — Theresa T Doan
(74) *Attorney, Agent, or Firm* — Ditthavong Mori & Steiner, P.C.

(57) ABSTRACT

A semiconductor device includes: an epitaxial layer; a body layer, formed in the epitaxial layer, which includes a channel region; a source layer disposed in superposition on the body layer; a gate insulator, formed on the epitaxial layer, which is in a ring shape surrounding the source layer; a gate electrode formed through the gate insulator; a drift layer, formed in the epitaxial layer, which is in a ring shape surrounding the body layer; and a drain layer formed in the surface of the epitaxial layer and disposed opposite to the source layer. The body layer is disposed such that the boundary surface at an end in the gate-width direction is in contact with the undersurface of the gate insulator. The gate insulator has a thick film portion thicker than a part above the channel region in the gate-length direction at least in a part where the gate insulator is in contact with the boundary surface of the body layer at the end in the gate-width direction.

10 Claims, 17 Drawing Sheets

100

100

100

100

FIG.5A
(i) 
P sub
(ii) 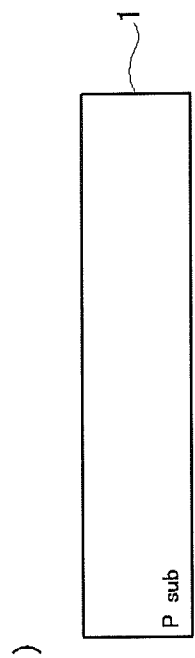
P sub
FIG.5B
(i) 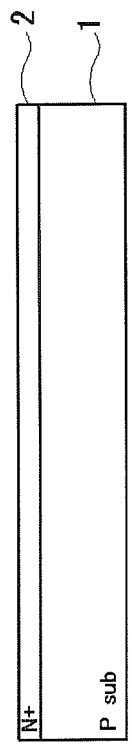
N+
P sub
(ii) 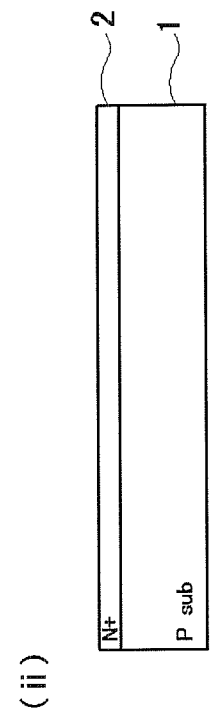
N+
P sub

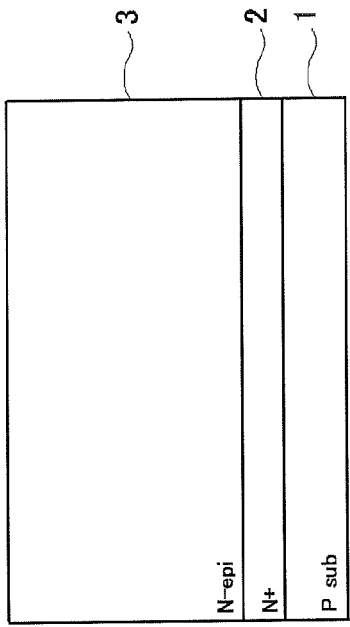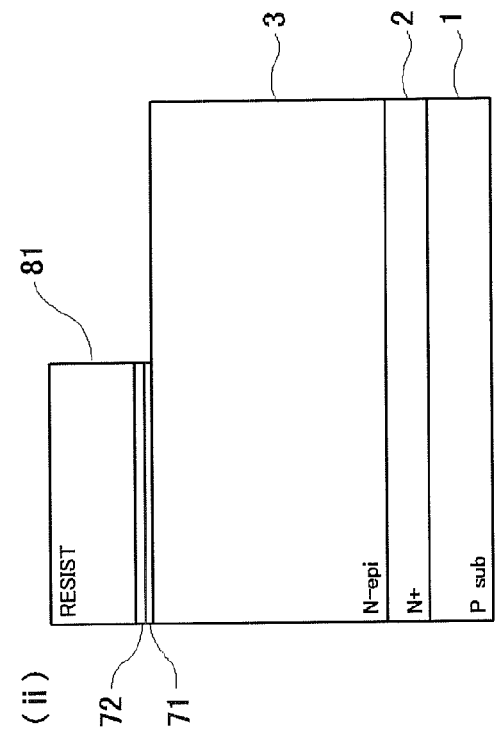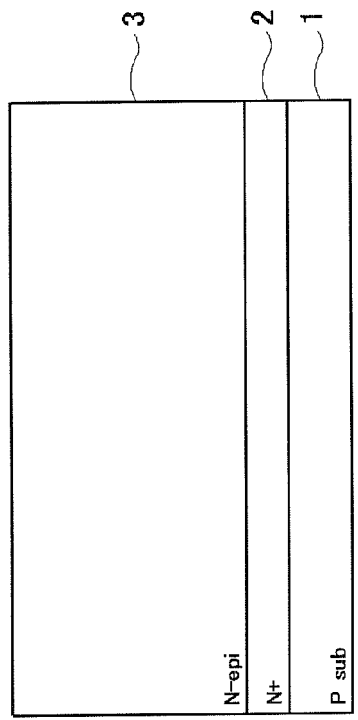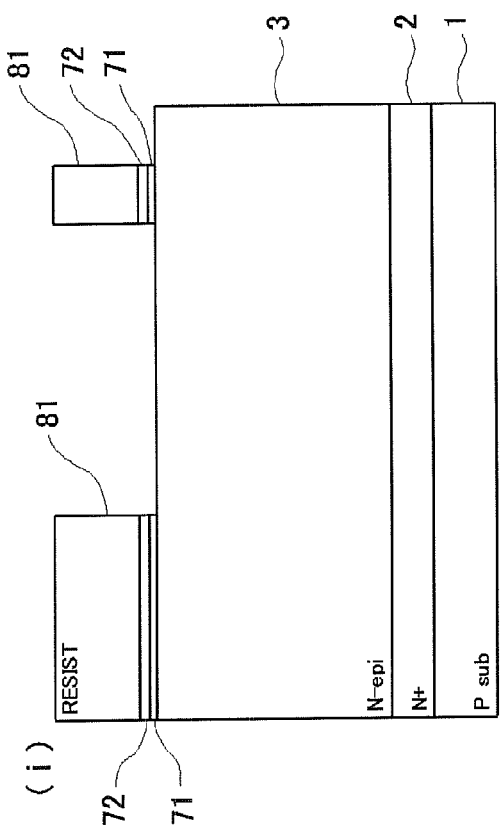
FIG.6A
FIG.6B

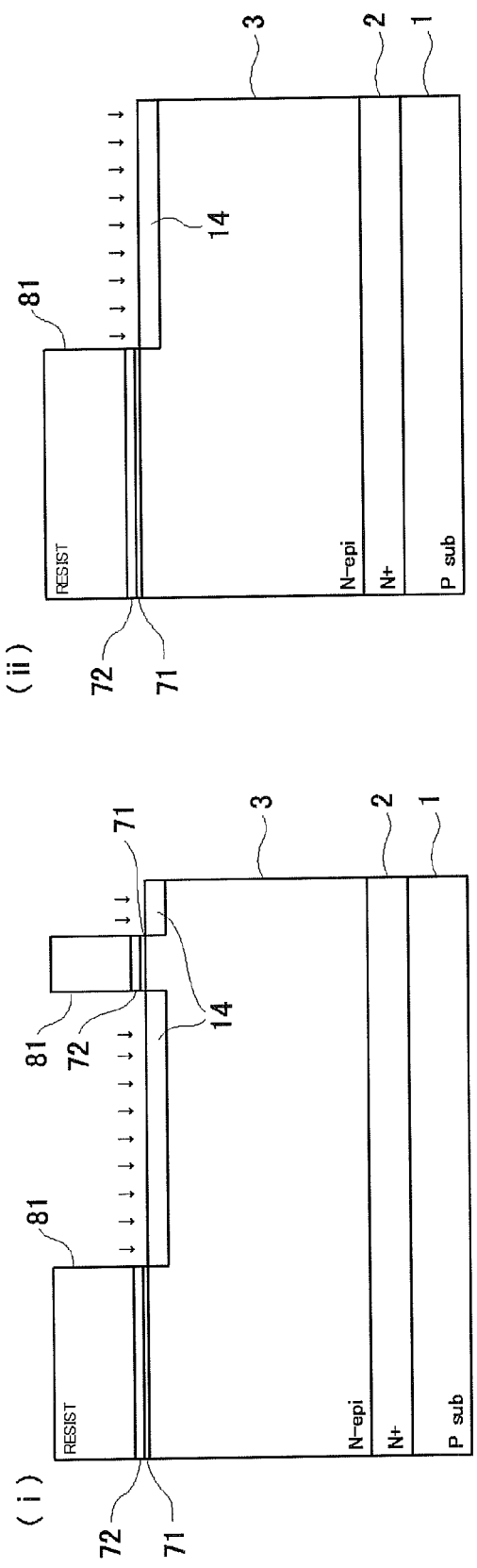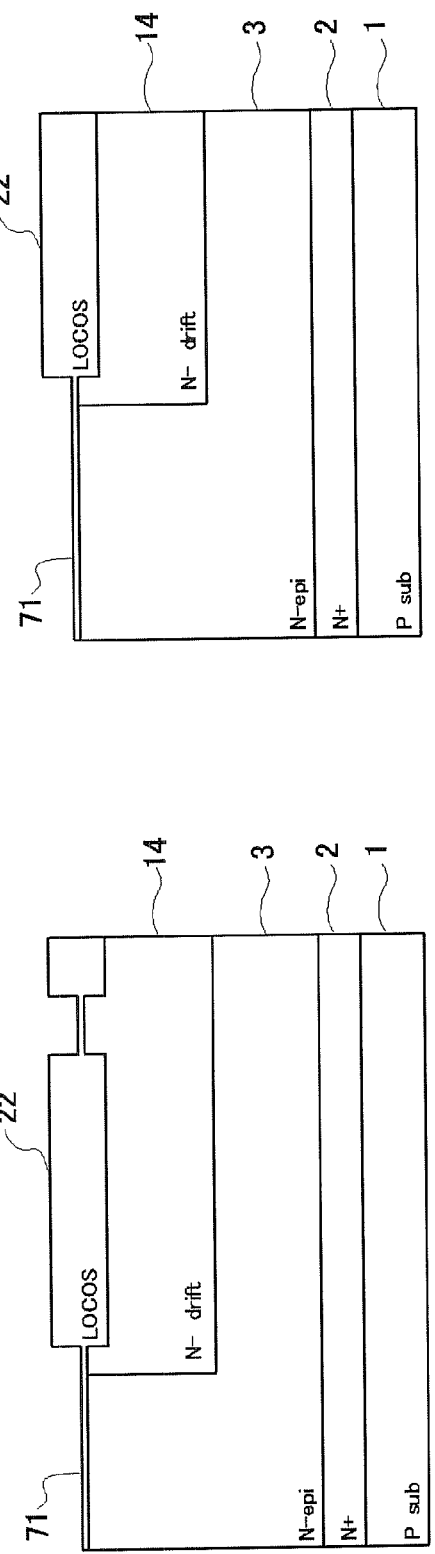

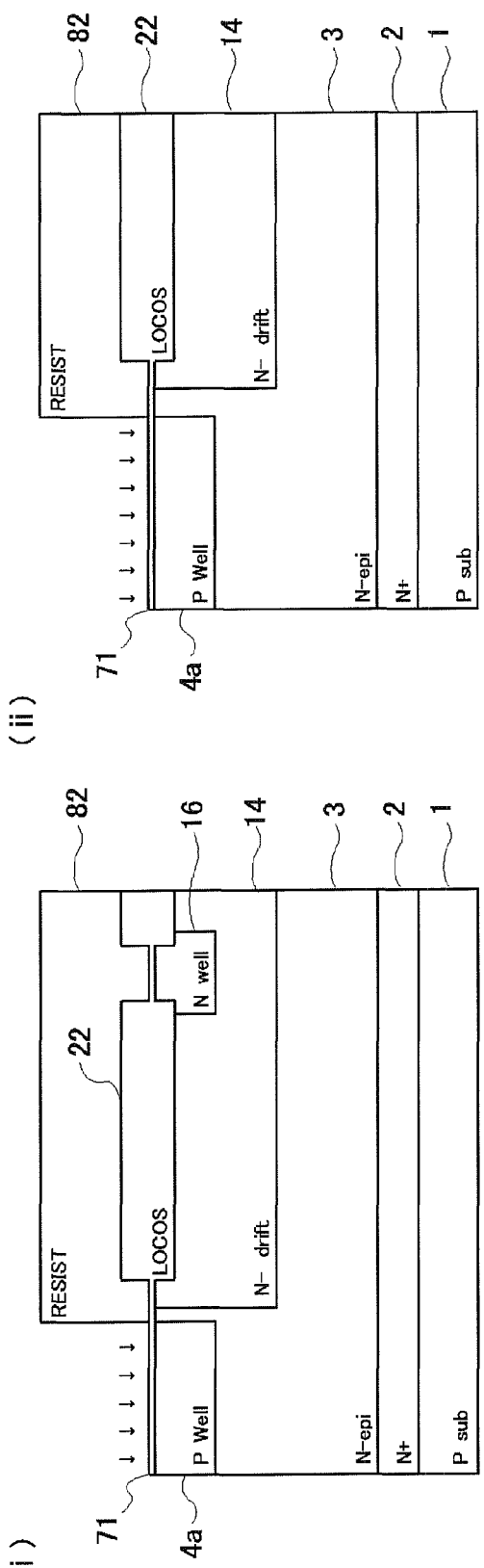
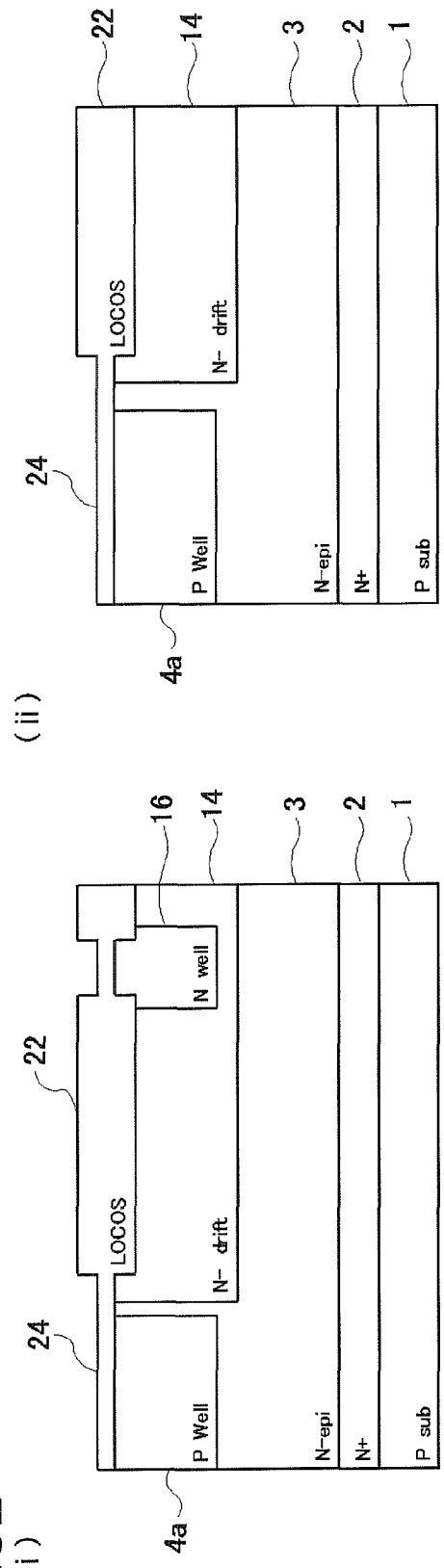

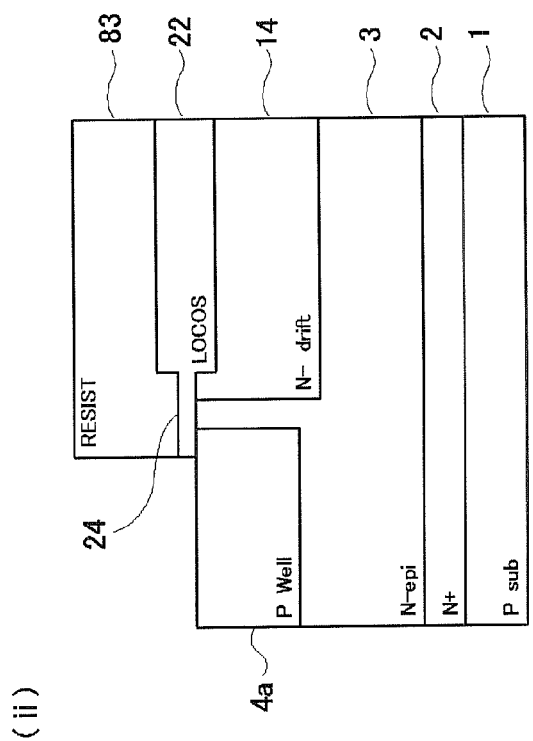
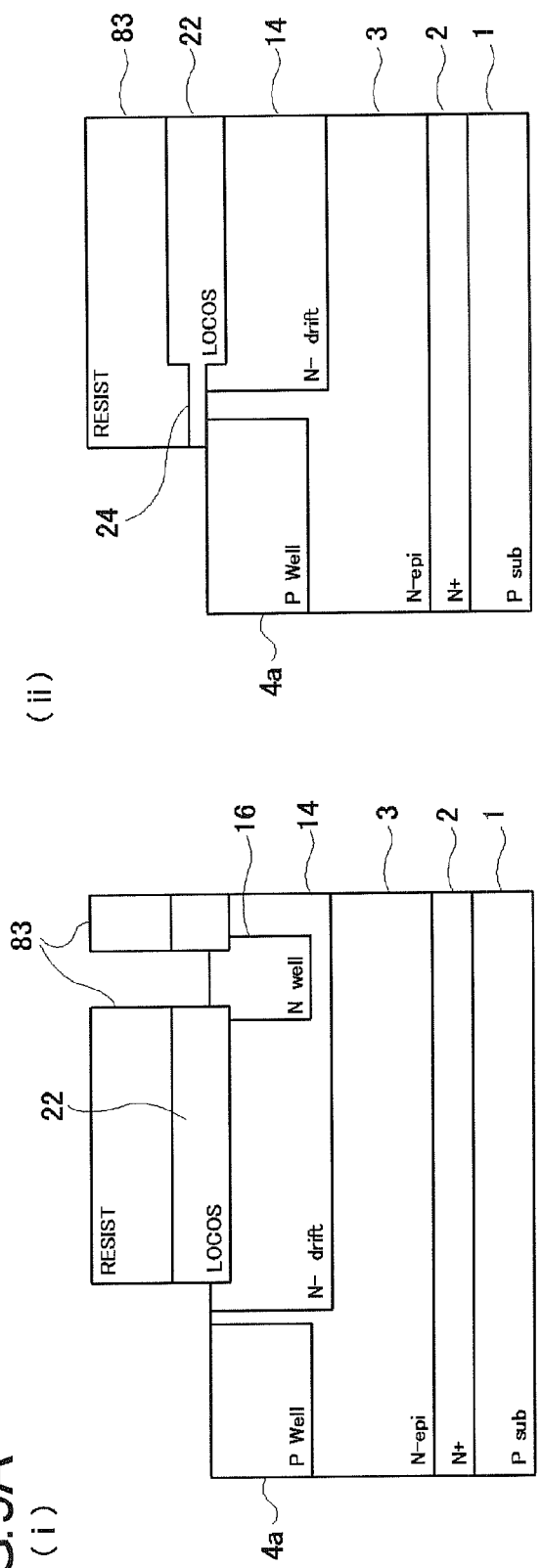
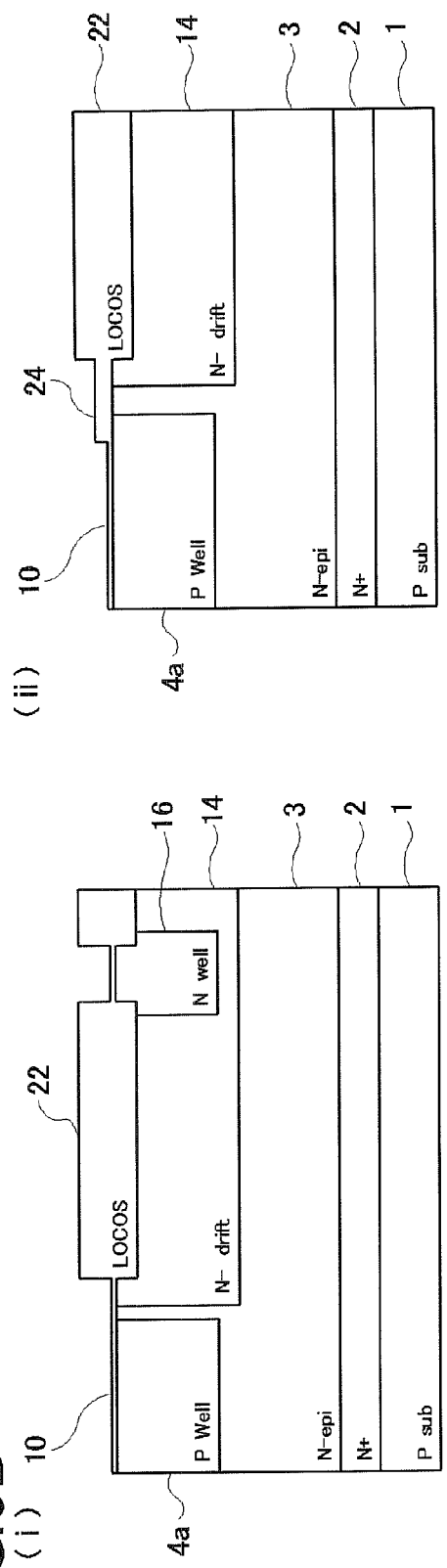

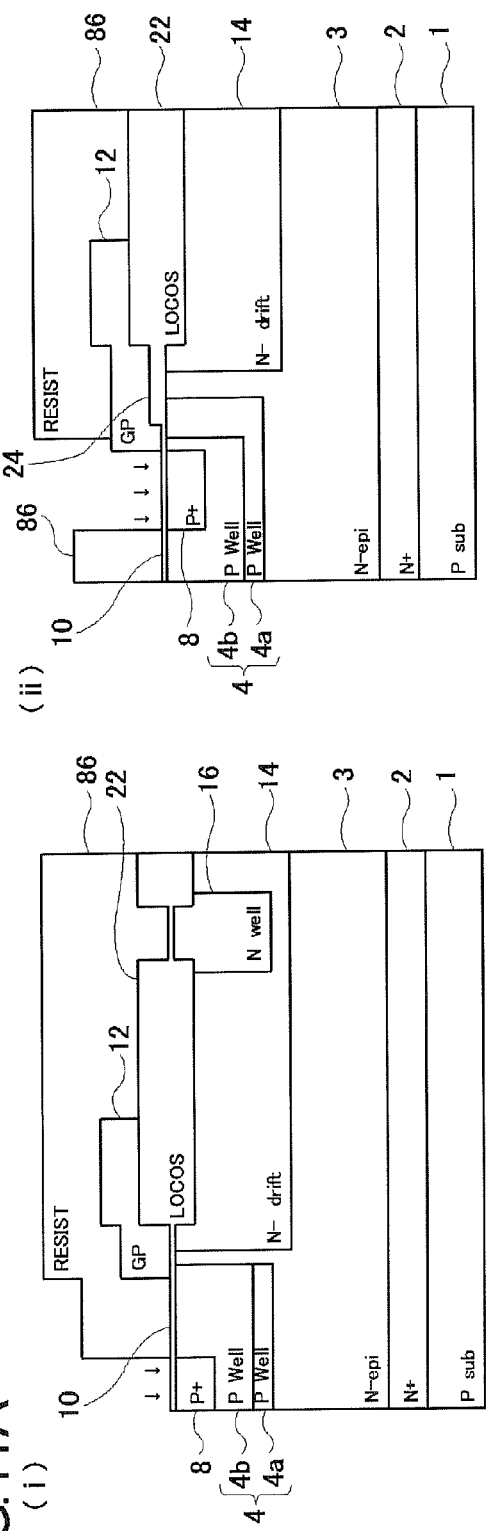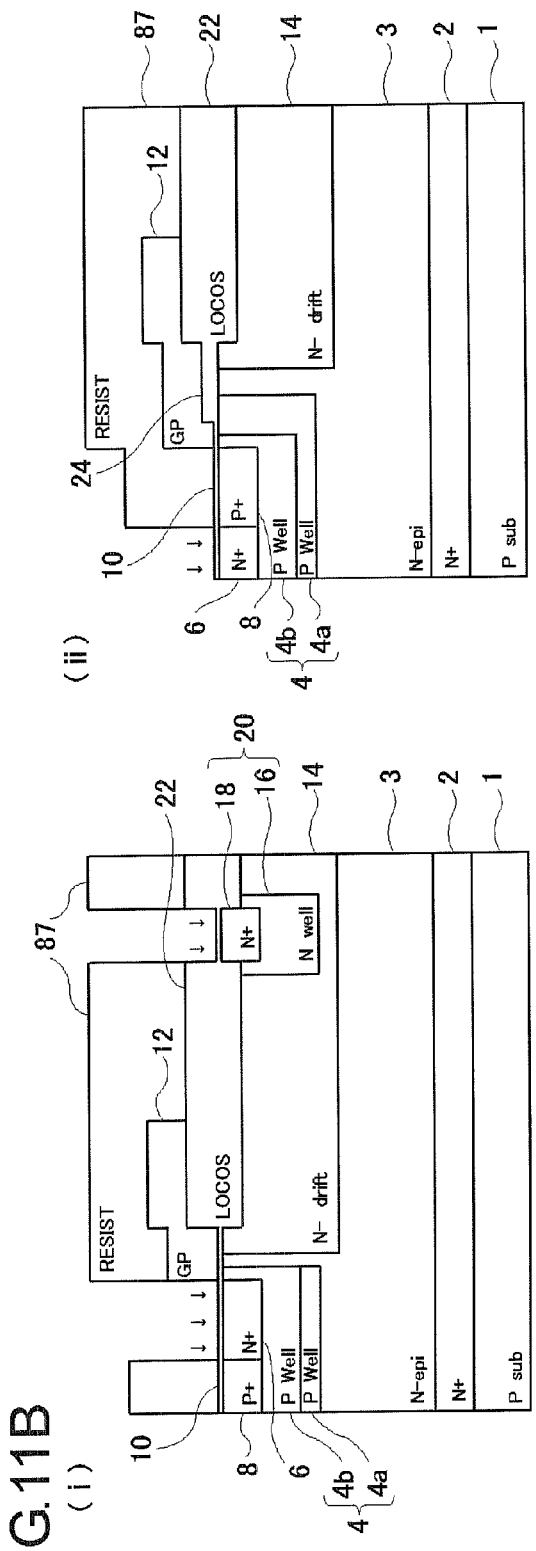

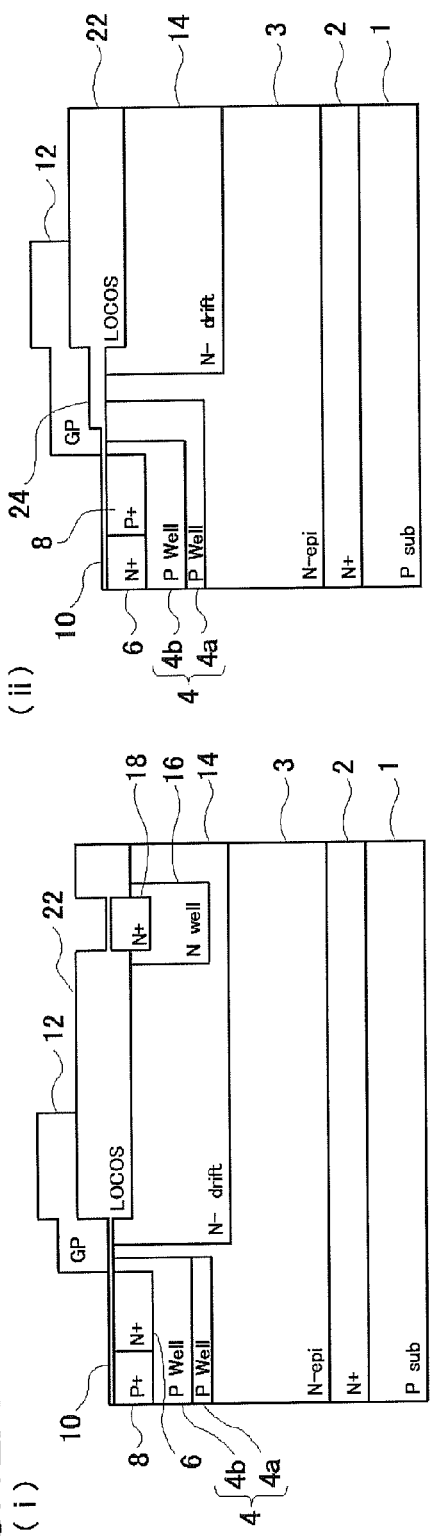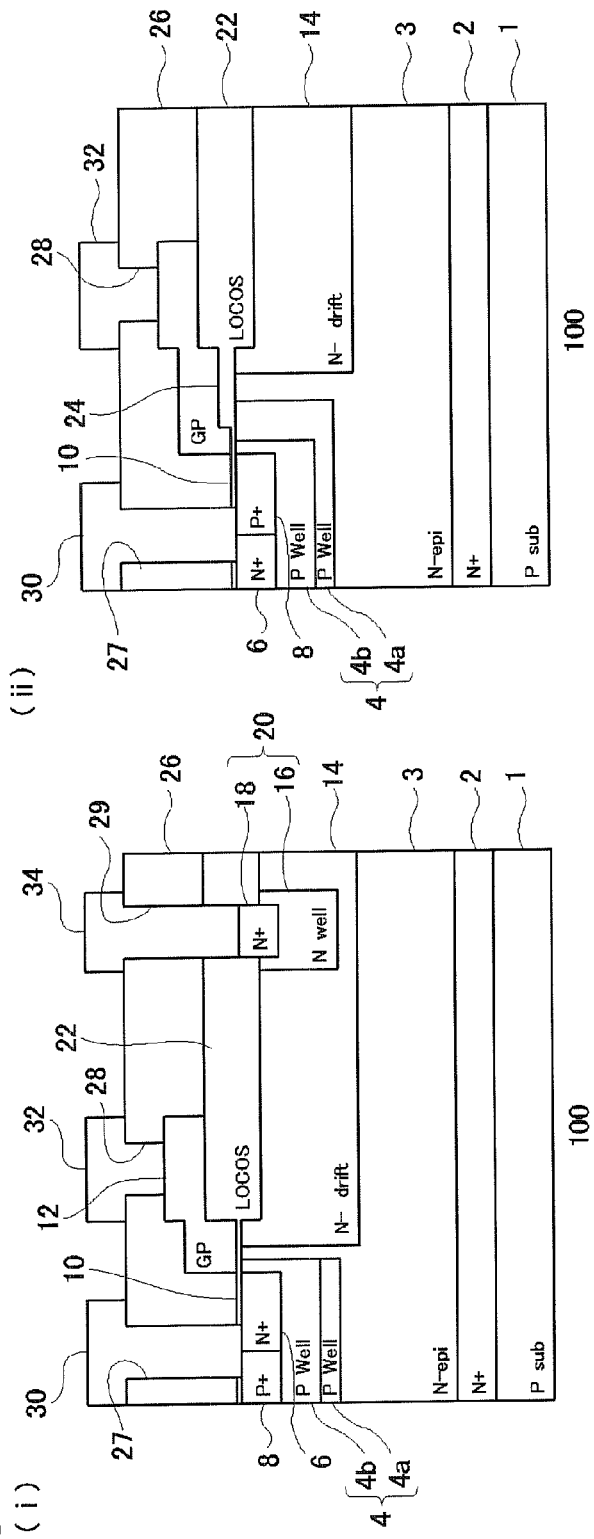

SEMICONDUCTOR DEVICE

CROSS-REFERENCE TO RELATED APPLICATIONS

This application is based upon and claims the benefit of priority from the prior Japanese Patent Application No. 2008-084797, filed on Mar. 27, 2008, the entire contents of which are incorporated herein by reference.

BACKGROUND OF THE INVENTION

1. Field of the Invention

The present invention relates to a semiconductor device. In particular, the invention relates to a power semiconductor device.

2. Description of the Related Art

A well-known power semiconductor device is a double-diffused metal oxide semiconductor (DMOS) transistor. The DMOS transistor is a MOS field-effect transistor for which a source layer and a channel-forming body layer are formed by double diffusion. The DMOS transistor has a wide range of applications including power supply circuits and driver circuits.

Among the DMOS transistors are laterally diffused (LD) MOS transistors which conduct currents laterally. An LDMOS transistor is structured as follows. For example, it is provided with an N-type epitaxial layer, and a P-type body layer is formed in the surface of the epitaxial layer. An N-type source layer is formed in superposition on the body layer, and a gate insulator (gate insulating film) is formed in a ring shape surrounding the source layer. A ring-shaped gate electrode is formed on an exposed part of the body layer without the source layer being formed therein, with the gate insulator interposed therebetween. An N-type drain layer is formed in the surface of the epitaxial layer in a position opposite to the source layer. A part of the body layer between the source layer and the drain layer forms a channel region.

A characteristic desired of such a DMOS transistor is a high breakdown voltage. A technology for raising the breakdown voltage is known where an offset region between a body layer and a drift layer constituting a part of the drain layer in a gate-length direction is formed and an offset region oxidized layer is formed on an offset region.

Under the foregoing circumstances, the inventors had come to recognize problems as described below. In a DMOS transistor having the above-described structure, the concentration of an impurity tends to increase at an end in a gate-width direction thereof, which brings about a convergence of electric field there. As a result, the high breakdown voltage characteristic can decline at an end in the gate-width direction. Also, in a DMOS transistor of the above-described structure, there exists an interface between a P-type body layer and an N-type epitaxial layer or drift layer below the end in the gate-width direction of the gate electrode. Hence, with a high voltage applied to the drain layer, the electric field intensity rises in a P-N junction below the gate electrode if there is an increase in the aforementioned impurity concentration at the end in the gate-width direction. This condition may cause a current to flow in the region at the end in the gate-width direction when the transistor is off. And the result will be the loss of desired high breakdown voltage characteristic. Thus the reduced high breakdown voltage characteristics at the end in the gate-width direction will limit the high breakdown voltage characteristic of the DMOS transistor.

SUMMARY OF THE INVENTION

The present invention has been made based on these understandings, and a general purpose thereof is to provide a technology for improving the high breakdown voltage performance of a semiconductor device such as DMOS transistors.

In order to solve the foregoing problems, one embodiment of the present invention relates to a semiconductor device. This semiconductor device comprises: a semiconductor layer; a body layer, formed in a surface of the semiconductor layer, which includes a channel region therein; a first impurity diffusion region formed in the surface of the semiconductor layer and disposed in superposition on the body layer; a gate insulator formed on the semiconductor layer; a gate electrode formed on the semiconductor layer including a portion above the channel region through the gate insulator disposed therebetween; a drift layer, formed in the semiconductor layer; and a second impurity diffusion region formed in the surface of the semiconductor layer and disposed opposite to the first impurity diffusion region, wherein the body layer is disposed such that a boundary surface thereof at an end in a gate-width direction is in contact with an undersurface of the gate insulator, and wherein the gate insulator has a thick film portion thicker than a part above the channel region in a gate-length direction at least in a part where the gate insulator is in contact with the boundary surface of the body layer at the end in a gate-width direction.

It is to be noted that any arbitrary combinations or rearrangement, as appropriate, of the aforementioned constituting elements and so forth are all effective as and encompassed by the embodiments of the present invention.

Moreover, this summary of the invention does not necessarily describe all necessary features so that the invention may also be sub-combination of these described features.

BRIEF DESCRIPTION OF THE DRAWINGS

Embodiments will now be described by way of examples only, with reference to the accompanying drawings which are meant to be exemplary, not limiting, and wherein like elements are numbered alike in several Figures in which:

FIG. 5A is a cross-sectional view showing a process in a method for manufacturing a semiconductor device;

FIG. 5B is a cross-sectional view showing a process in a method for manufacturing a semiconductor device;

FIG. 6A is a cross-sectional view showing a process in a method for manufacturing a semiconductor device;

FIG. 6B is a cross-sectional view showing a process in a method for manufacturing a semiconductor device;

FIG. 7A is a cross-sectional view showing a process in a method for manufacturing a semiconductor device;

FIG. 7B is a cross-sectional view showing a process in a method for manufacturing a semiconductor device;

FIG. 8A is a cross-sectional view showing a process in a method for manufacturing a semiconductor device;

FIG. 8B is a cross-sectional view showing a process in a method for manufacturing a semiconductor device;

FIG. 9A is a cross-sectional view showing a process in a method for manufacturing a semiconductor device;

FIG. 9B is a cross-sectional view showing a process in a method for manufacturing a semiconductor device;

FIG. 11A is a cross-sectional view showing a process in a method for manufacturing a semiconductor device;

FIG. 11B is a cross-sectional view showing a process in a method for manufacturing a semiconductor device;

FIG. 12A is a cross-sectional view showing a process in a method for manufacturing a semiconductor device;

FIG. 12B is a cross-sectional view showing a process in a method for manufacturing a semiconductor device;

DETAILED DESCRIPTION OF THE INVENTION

Figure 1:
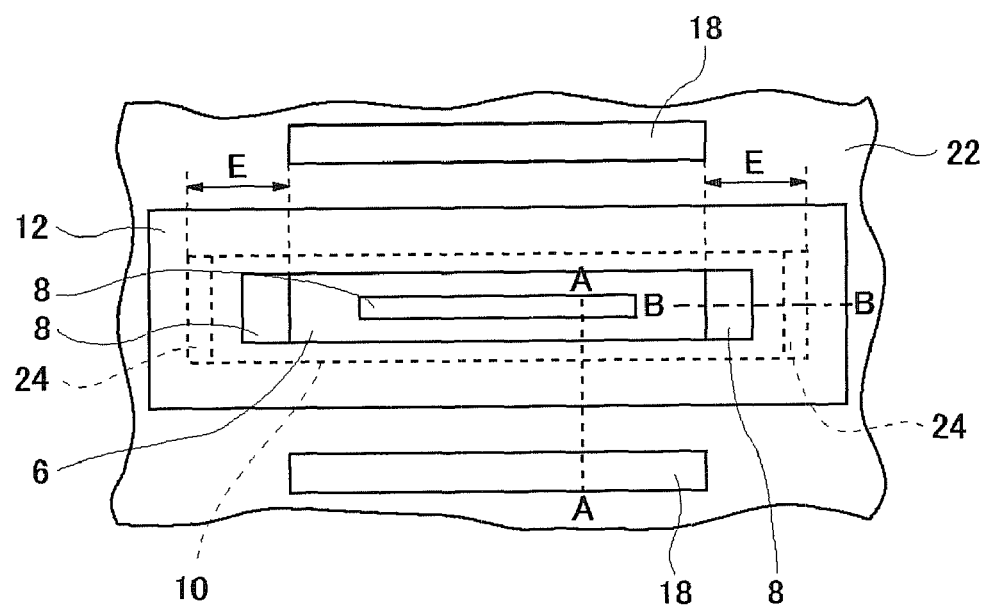
FIG. 1 is a schematic plan view of a semiconductor device according to a first embodiment of the present invention.

The invention will now be described by reference to the preferred embodiments. This does not intend to limit the scope of the present invention, but to exemplify the invention.

The embodiments will now be described with reference to drawings. Note that in all of the Figures the same components, parts and processings are given the same reference numerals and the repeated description thereof is omitted as appropriate. Moreover, the embodiments given are for illustrative purposes only and all features and their combination thereof described in the present embodiments are not necessarily essential to the invention.

First Embodiment

Figure 2:
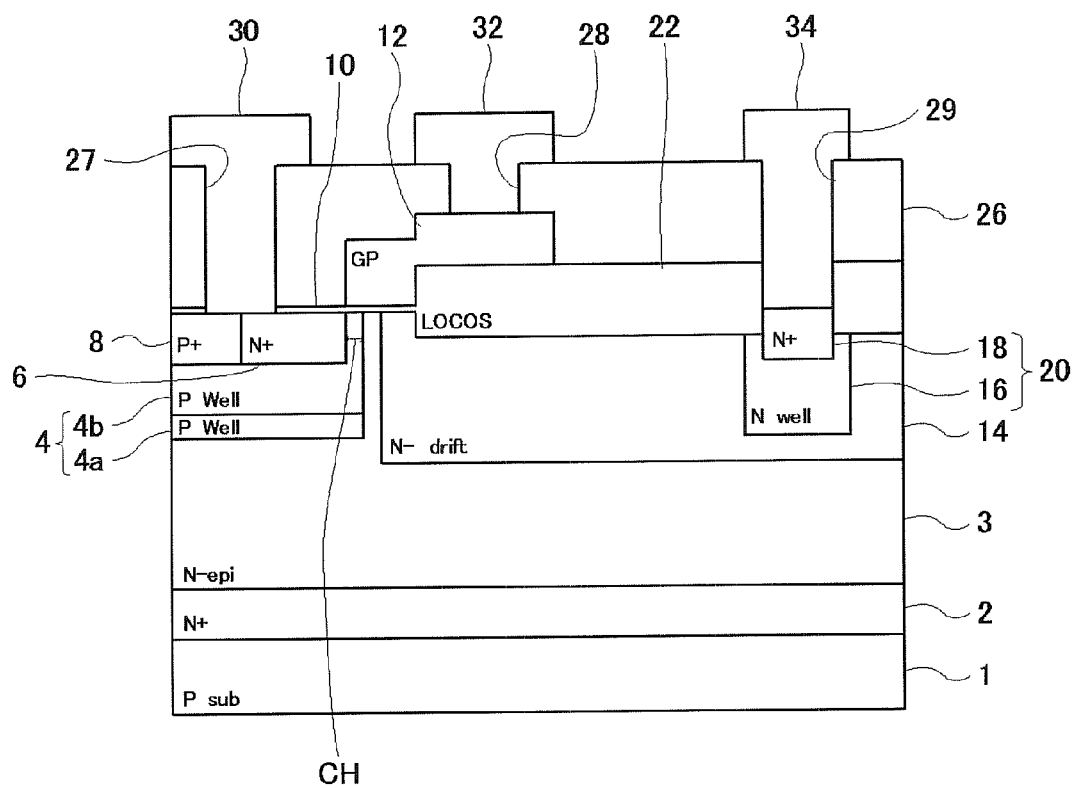
FIG. 2 is a cross-sectional view taken along the line A-A of FIG. 1.
Figure 3:
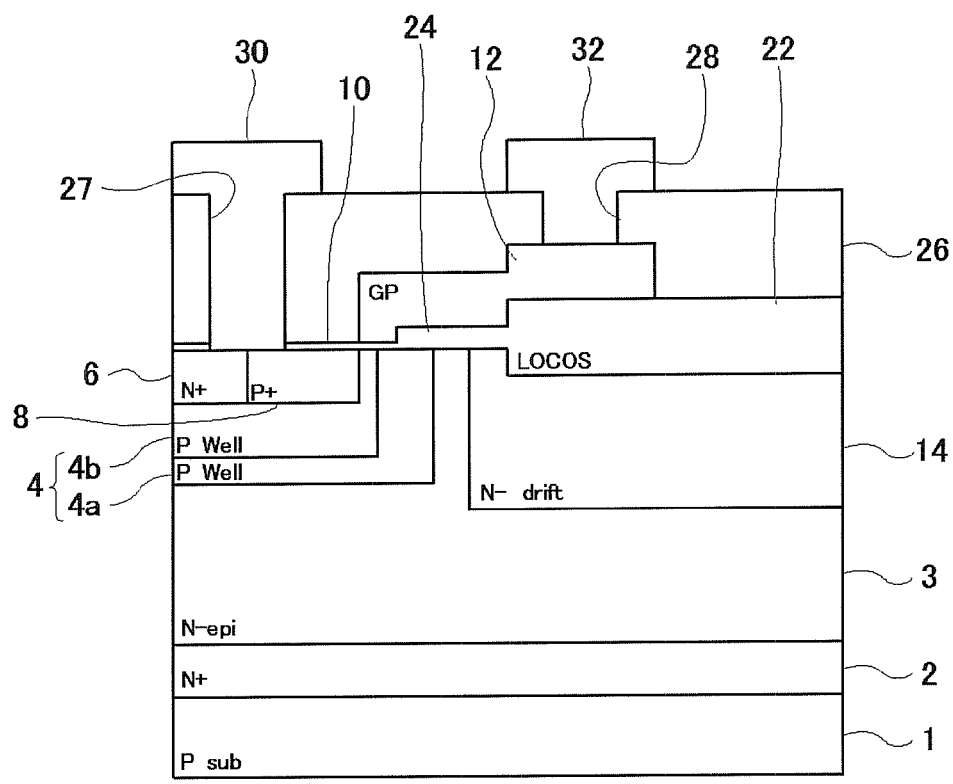
FIG. 3 is a cross-sectional view taken along the line B-B of FIG. 1.

FIG. 1 is a schematic plan view of a semiconductor device 100 according to a first embodiment of the present invention. FIG. 2 is a cross-sectional view taken along the line A-A of FIG. 1. FIG. 3 is a cross-sectional view taken along the line B-B of FIG. 1. The first embodiment will be described using an N-channel type LDMOS transistor as an example of the semiconductor device 100. Note that in FIG. 1, interlayer insulation films, electrodes, and the like are omitted for ease of explanation.

As illustrated in FIGS. 1 to 3, the semiconductor device 100 includes a P-type, single-crystal silicon substrate 1, an $N^+$-buried semiconductor layer 2 formed on the silicon substrate 1, and an $N^-$-epitaxial layer 3 (semiconductor layer) formed on the buried semiconductor layer 2. In the first embodiment, only one epitaxial layer 3 is used, but a plurality of epitaxial layers may be stacked. Formed in a surface of the epitaxial layer 3 is a P-type body layer 4 in which a P-type impurity is diffused. The body layer 4 has a double structure composed of a low-concentration layer 4a with a relatively low concentration of the P-type impurity and a high-concentration layer 4b with a shallowly diffused but higher concentration of the P-type impurity than the low-concentration layer 4a. The low-concentration layer 4a provides high breakdown voltage characteristics whereas the high-concentration layer 4b adjusts the threshold value thereof. The body layer 4 is disposed such that the boundary surface thereof at an end in a gate-width direction is in contact with an undersurface of a gate insulator (gate insulating film) 10 to be described later. The boundary surface in contact with the undersurface of the gate insulator 10 is approximately U-shaped in plan view. Formed in the body layer 4 is an $N^+$-source layer 6 (first impurity diffusion region) in superposition on the body layer 4 and having a high-concentration N-type impurity diffused shallower than the body layer 4. Also, formed adjacent to the source layer 6 in the body layer 4 is a $P^+$-diffusion layer 8 having a high-concentration P-type impurity diffused and functioning to fix the potential of the body layer 4. The source layer 6 and the diffusion layer 8, connected to a source electrode 30, are of the same potential. The source layer 6 is formed in a ring shape surrounding the diffusion layer 8. However, at ends in the gate-width direction of the source layer 6, the diffusion layer 8 is positioned outside the source layer 6 and surrounded by the boundary surface of the body layer 4, so that the inversion of potential at both the ends in the gate-width direction is prevented.

Formed on the epitaxial layer 3 including part of the body layer 4 is a gate insulator 10 in a ring shape surrounding the source layer 6. The gate insulator 10 is, for instance, a silicon dioxide film, and the thickness is, for instance, about 12 to 20 nm. Also, provided above an exposed part of the body layer 4 without the source layer 6 being formed therein is a gate electrode 12 with the gate insulator 10 interposed therebetween. In this first embodiment, the gate electrode 12 is formed in a ring shape surrounding the source layer 6, but the shape of the gate electrode 12 is not particularly limited thereto. For example, the arrangement may be such that two electrodes extend in the gate-width direction with the source layer 6 disposed in between. The gate electrode 12 may be a polysilicon film or the like. The gate electrode 12 is such that one end thereof in the gate-length direction is adjacent to the source layer 6 and the other end thereof extends on the gate insulator 10 and part of a field insulating film 22 (described later). And the part of the exposed body layer 4 without the source layer 6 being formed, which is located below the gate electrode 12 and between the source layer 6 and a drain layer 20 (described later), forms a channel region CH.

Formed in a surface portion of the epitaxial layer 3 is an $N^-$-drift layer 14, in a ring shape surrounding the body layer 4, in which a higher-concentration N-type impurity than in the epitaxial layer 3 is diffused. In the drift layer 14, an N-type N well layer 16, in which a higher-concentration N-type impurity than in the drift layer 14 is diffused, is formed in such a manner as to cover an $N^+$-drain contact layer 18 (described later). On a top surface of the N well layer 16, an $N^+$-drain contact layer 18 is formed, in which an even higher-concentration N-type impurity is diffused, and the N well layer 16 and the drain contact layer 18 constitute a drain layer 20 (second impurity diffusion region). The N well layer 16 is provided to lessen the convergence of electric field in the drain layer 20. The drift layer 14 is also located between the source layer 6 and the drain contact layer 18, and a thick field insulating film 22 is formed on the epitaxial layer 3 and the drift layer 14 by the LOCOS (Local Oxidation of Silicon) method or the like. As illustrated in FIG. 2, the field insulating film 22 is in contact with the gate insulator 10; and particularly at the end in the gate-length direction, it is in contact with the gate insulator 10 at a point outside of the boundary surface of the body layer 4. The film thickness of the field insulating film 22 is, for instance, about 250 to 1000 nm.

Here, it is to be noted that the gate insulator 10, as illustrated in FIG. 3, has a thick film portion 24 thicker than the part above the channel region CH in the gate-length direction at least in a part where the gate insulator 10 is in contact with the boundary surface of the body layer 4 at an end E in the gate-width direction. As illustrated in FIG. 1, the end E in the gate-width direction of the gate insulator 10 is an extended part in an inactive region of the gate insulator 10. The thickness of the thick film portion 24, which can vary with a target breakdown voltage, is, for instance, about 80 to 150 nm. The thick film portion 24 is located in a region where the electric field converges, for example, a region in the end E, in the gate-width direction where the gate insulating film 10 is in contact with the field insulating film 22. In the first embodiment, the thick film portion 24 is located in a region, where the gate insulator 10 is in contact with the field insulating film 22, closer to the extreme end than the diffusion layer 8 in the end E in the gate-width direction of the gate insulator 10. In the semiconductor device 100, the concentration of an impurity in the drift layer 14, for instance, is likely to increase at the end E in the gate-width direction, and the electric field tends to converge on the boundary surface region of the body layer 4 due to the presence of the gate electrode 12 and the drain layer 20. In the first embodiment, the convergence of an electric field is alleviated by providing the thick film portion 24 at least in a part of the gate insulator 10 on the boundary surface region of the body layer 4, with the result that the high breakdown voltage characteristic of the semiconductor device 100 is improved.

In a transistor as thus far described, an interlayer insulation film 26 is formed as illustrated in FIG. 2 and FIG. 3. The interlayer insulation film 26 may be a BPSG (Boron-Phospho-Silicate Glass) film, a SOG (Spin On Glass) film, a NSG (Non-doped Silicate Glass) film, or the like. Contact holes 27, 28 and 29 are formed in the interlayer insulation film 26. And formed in the contact holes 27, 28 and 29 are a source electrode 30, a gate electrode wiring layer 32 and a drain electrode 34, respectively, by selectively forming an aluminum alloy film such as an aluminum-silicon (Al—Si) film, aluminum-silicon-copper (Al—Si—Cu) film, and aluminum-copper (Al—Cu) film.

Figure 4A:
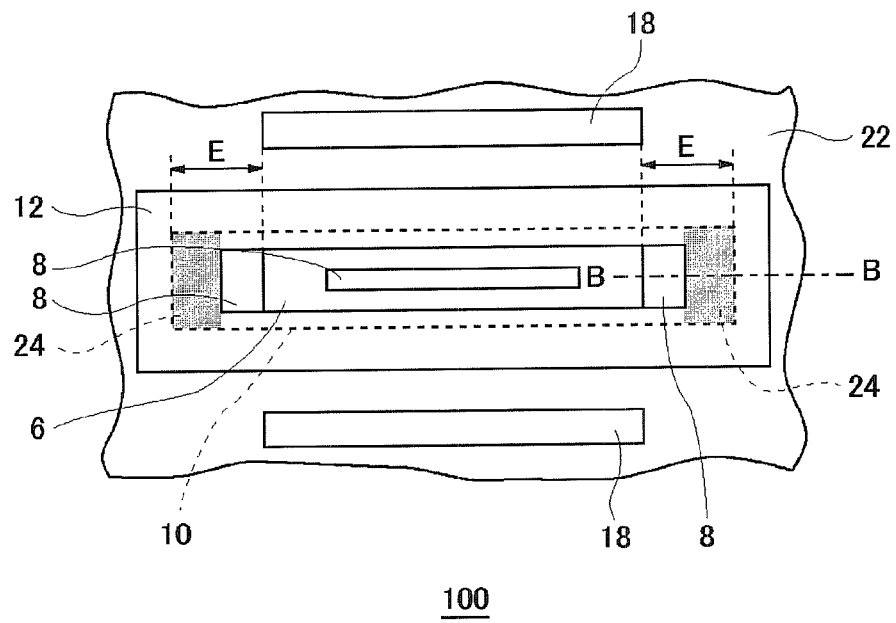
FIG. 4A is a schematic illustration showing regions where thick film portions are located.
Figure 4B:
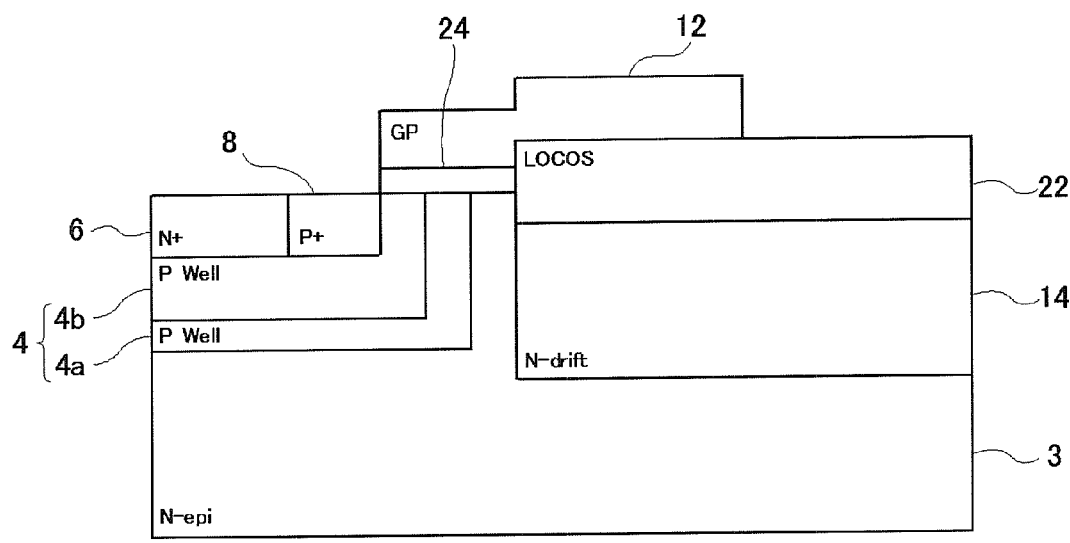
FIG. 4B is a schematic illustration showing regions where thick film portions are located.

It is to be noted that the thick film portion 24 may be formed in the entirety on an extreme end side of the diffusion layer 8 in the end E in the gate-width direction of the gate insulator 10 as shown in FIGS. 4A and 4B. In such an arrangement, the convergence of an electric field occurring in the end E in the gate-width direction can be alleviated more effectively. Also, the wider area of the thick film portion 24 gives a higher degree of freedom in the extent of diffusion in the body layer 4. FIGS. 4A and 4B are schematic illustrations showing the regions where the thick film portions 24 are located. FIG. 4A is a schematic plan view of the semiconductor device 100, whereas FIG. 4B is a cross-sectional view taken along the line B-B of FIG. 4A. Note that in FIGS. 4A and 4B, the silicon substrate 1, the buried semiconductor layer 2, the interlayer insulation films, the electrodes and the like are omitted as appropriate.

Next, a description will be given of a method for manufacturing a semiconductor device 100 according to the first embodiment of the present invention. FIGS. 5A through 12B are cross-sectional views showing a process in a method for manufacturing a semiconductor device 100. In each of the Figures, (i) is a cross-sectional view taken along the line A-A of FIG. 1, and (ii) is a cross-sectional view taken along the line B-B of FIG. 1.

First, as shown in FIG. 5A, a P-type single-crystal silicon substrate 1, for instance, is prepared as a P-type single-crystal semiconductor substrate.

Then, as shown in FIG. 5B, an $N^+$-buried semiconductor layer 2 is formed as a high-concentration N-type impurity, such as antimony (Sb) or arsenic (As), is ion-implanted or applied and then diffused in a surface layer of the silicon substrate 1.

Then, as shown in FIG. 6A, an $N^-$-epitaxial layer 3 is grown epitaxially on the buried semiconductor layer 2. In this process, the buried semiconductor layer 2 undergoes diffusion with the heat from the epitaxial growth.

Next, as shown in FIG. 6B, a silicon dioxide film 71 and a silicon nitride film 72 are formed in the surface of the epitaxial layer 3, and then a resist 81 of a predetermined pattern is formed on top of them by a known photolithography technique. Then the silicon dioxide film 71 and the silicon nitride film 72 in a drift layer forming region are selectively removed by etching with the resist 81 as the mask. Note that the silicon dioxide film 71 may be left without being removed.

Then, as shown in FIG. 7A, a drift layer 14 is formed in a surface region of the epitaxial layer 3 by ion implantation of phosphorous (P) or arsenic using the resist 81 as the mask. Note that a screen oxide film used at the ion implantation is not shown in the Figure. Also note that the silicon dioxide film 71, if it remains without being removed, can be used as the screen oxide film.

Then, as shown in FIG. 7B, after the resist 81 is removed, a field insulating film 22 is formed through thermal oxidation of a surface region of the epitaxial layer 3 using the silicon nitride film 72 as the mask. Then the silicon nitride film 72 is removed. In this process, the drift layer 14 is diffused into the epitaxial layer 3 by the thermal oxidation of the epitaxial layer 3.

Next, as shown in FIG. 8A, a resist 82 is formed on an oxide film with the exception of a body layer 4 forming region by a known photolithography technique. Then a low-concentration layer 4a constituting a body layer 4 is formed in a surface of the epitaxial layer 3 by ion implantation of boron (B), using the resist 82 as the mask and the silicon dioxide film 71 as the screen oxide film. Although the process illustration is omitted here, a resist of a predetermined pattern is formed by a known photolithography technique prior to the formation of the resist 82, and an N-type N well layer 16 is formed in a surface of the drift layer 14 by ion implantation of an N-type impurity using the resist as the mask.

Then, as shown in FIG. 8B, after the resist 82 is removed, the silicon dioxide film 71 is removed and a thick film portion 24 is formed in a surface of the epitaxial layer 3 by thermal oxidation. The thermal oxidation of the epitaxial layer 3 to form the thick film portion 24 may be done using the thermal oxidation at the forming of a gate oxide film of another device such as a high-voltage MOS transistor.

Next, as shown in FIG. 9A, a resist 83 of a predetermined pattern is formed on top of the thick film portion 24 and the field insulating film 22 by a known photolithography technique. Then the thick film portion 24 is selectively removed by etching with the resist 83 as the mask. As a result, the thick film portion 24 is formed in the predetermined region. Note that the thick film portion 24 can be formed in any desired region by changing the pattern of the resist 83.

Then, as shown in FIG. 9B, after the resist 83 is removed, a gate insulator 10 is formed through thermal oxidation of a surface region of the epitaxial layer 3.

Figure 10A:
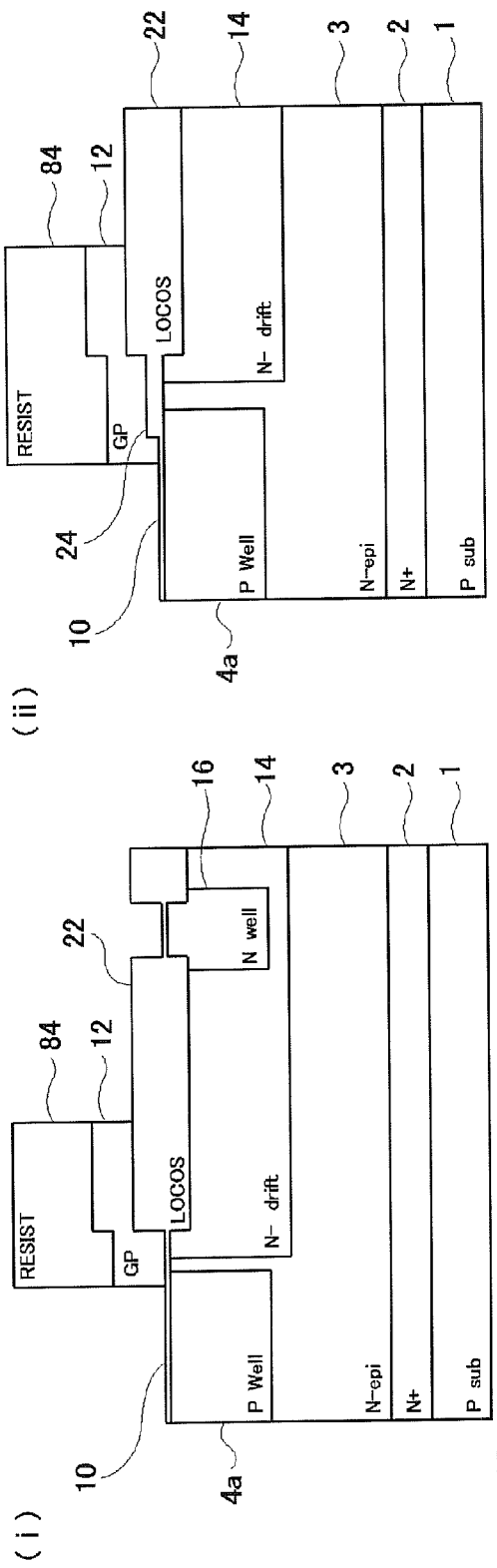
FIG. 10A is a cross-sectional view showing a process in a method for manufacturing a semiconductor device.

Next, as shown in FIG. 10A, a polysilicon film is deposited on the epitaxial layer 3 by chemical vapor deposition (CVD) or the like, with the gate insulator 10, the thick film portion 24 and the field insulating film 22 interposed between the polysilicon film and the epitaxial layer 3. Then a resist 84 of a predetermined pattern is formed in such a manner as to cover the gate electrode forming region by a known photolithography technique. And a gate electrode 12 is formed as the polysilicon film is selectively removed by etching using the resist 84 as the mask.

Figure 10B:
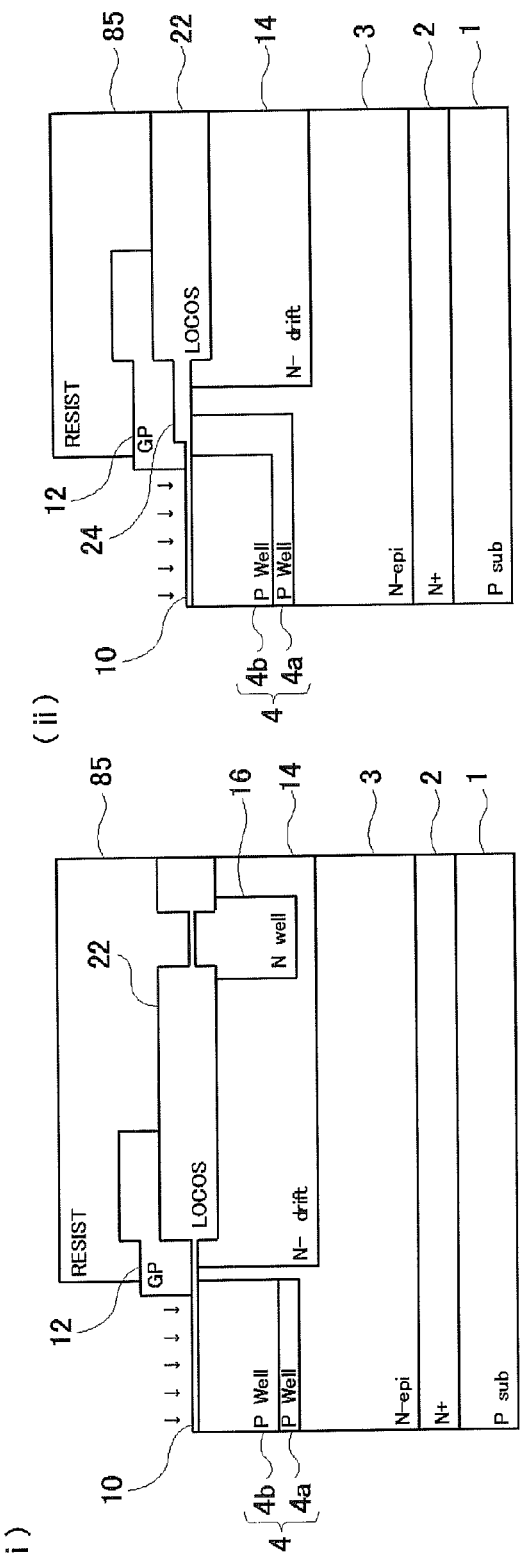
FIG. 10B is a cross-sectional view showing a process in a method for manufacturing a semiconductor device.

Then, as shown in FIG. 10B, after the resist 84 is removed, a resist 85 of a predetermined pattern is formed on the surface excepting the region for the body layer 4, by a known photolithography technique. Then boron is ion-implanted into a low-concentration layer 4a using the resist 85 and the gate electrode 12 as the mask, and the boron ions are diffused shallower than the low-concentration layer 4a to form a P-type high-concentration layer 4b. In this manner, the body layer 4 is formed, and the high-concentration layer 4b adjusts a threshold voltage Vt in the body layer 4.

Next, as shown in FIG. 11A, after the resist 85 is removed, a resist 86 of a predetermined pattern is formed on the surface areas excepting a part of the body layer forming region, by a known photolithography technique. Then a high-concentration boron is ion-implanted into the body layer 4 using the resist 86 as the mask to form a P$^+$-diffusion layer 8. Note that although the process illustration is omitted here, a lightly-doped drain (LDD) region is formed after the removal of the resist 86, and a not-shown side wall is formed on the side of the gate electrode 12.

Then, as shown in FIG. 11B, after the resist 86 is removed, a resist 87 of a predetermined pattern is formed in the surface excepting the source layer and drain contact layer forming regions, by a known photolithography technique. Then a high-concentration arsenic is ion-implanted using the resist 87, the gate electrode 12 and the not-shown side wall as the mask so as to form an N$^+$-source layer 6 and a drain contact layer 18 in a self-aligned manner.

Thus, as shown in FIG. 12A, a semiconductor device 100 is formed with the removal of the resist 87. Then, as shown in FIG. 12B, wiring processes as described below are carried out. First, an interlayer insulation film 26, such as a BPSG film, a SOG film or a NSG film, is formed on top of the epitaxial layer 3. Then contact holes 27, 28 and 29 are formed in the interlayer insulation film 26 by a known photolithography technique and a dry etching using a $CHF_3$ or $CF_4$ gas. Then a source electrode 30, a gate electrode wiring layer 32 and a drain electrode 34 are formed in the contact holes 27, 28 and 29, respectively, by selectively forming an aluminum alloy film such as an aluminum-silicon film, aluminum-silicon-copper film or aluminum-copper film.

Through the processes as described above, a semiconductor device 100 is produced. Note that if it is necessary to dope the gate electrode 12 with an impurity, it may be done by an ion implantation or a heat treatment with a gas containing a dopant at the point when a polysilicon film is deposited as shown in FIG. 10A. Alternatively, it may be done by an ion implantation simultaneously when high-concentration arsenic ions are implanted to form the source layer 6 and the drain contact layer 18 as shown in FIG. 11B.

Figure 13:
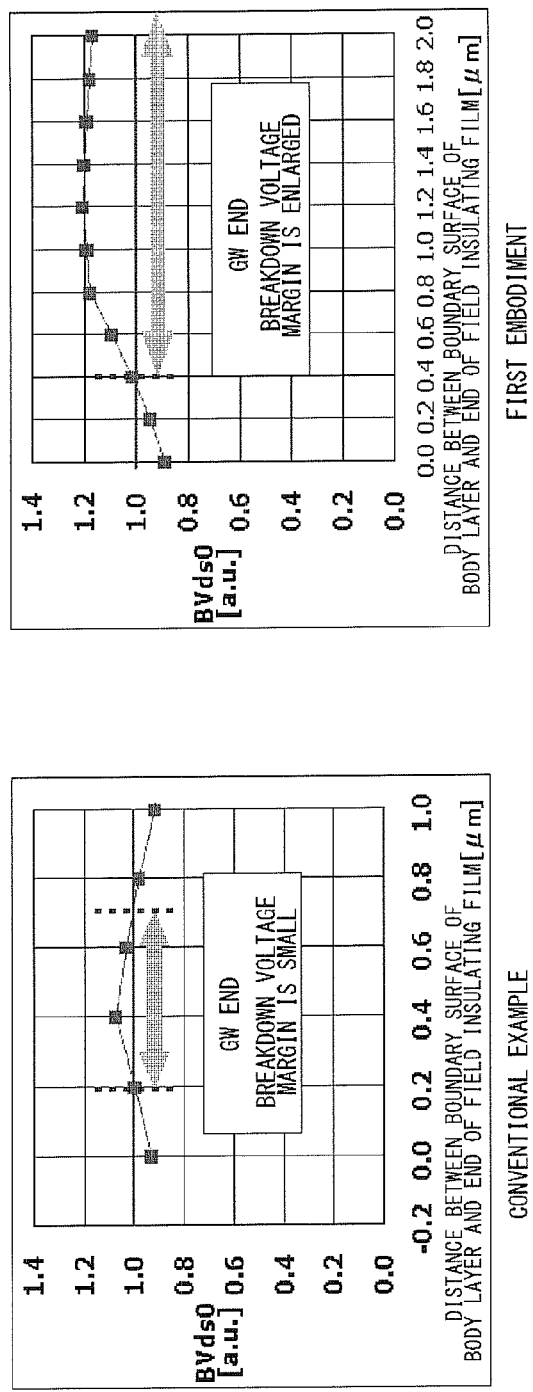
FIG. 13 is graphs showing changes in breakdown voltage value at an end in a gate-width (GW) direction of a conventional semiconductor device and a semiconductor device according to a first embodiment of the present invention.

FIG. 13 is graphs showing changes in breakdown voltage value at the end in the gate-width (GW) direction of a conventional semiconductor device and a semiconductor device 100 according to the first embodiment of the present invention. In FIG. 13, the left-hand graph, which represents the results of the conventional semiconductor device, and the right-hand graph, which represents the results of the semiconductor device 100 of the first embodiment, show the relationships between the drain-source breakdown voltage and the distance of the boundary surface of the body layer 4 from the end of the field insulating film 22. Note that the horizontal axis of the graphs represents an amount of dislocation from a reference position (0, 0) which is a predetermined position on the boundary surface of the body layer 4, and note also that the direction away from the field insulating film 22 is designated as plus (+).

As can be seen in FIG. 13, the breakdown voltage at the end E in the gate-width direction, normalized by the target breakdown voltage value, is less than approximately 1.1 for the conventional semiconductor device in contrast to approximately 1.2 for the first embodiment. This means that the semiconductor device 100 of the first embodiment displays an improved breakdown voltage performance in the gate-width direction. Also, when the target drain-source breakdown voltage is 1.0 for instance, the first embodiment shows a much greater boundary extent (breakdown voltage margin) of the body layer 4, where breakdown voltages above the target breakdown voltage can be obtained, than the conventional semiconductor device. This means the absence of any excessive demand for improved accuracy of ion implantation at the forming of the body layer 4.

As already described above, the semiconductor device 100 according to the first embodiment has a thick film portion thicker than the part above the channel region CH in the gate-length direction at least in a part where the gate insulator 10 is in contact with the boundary surface of the body layer 4 at the end E in the gate-width direction. Consequently, the convergence of an electric field in the end region in the gate-width direction is alleviated with the result that the high breakdown voltage characteristic of the semiconductor device 100 is improved.

Also, the improved high breakdown voltage characteristic at the end in the gate-width direction can extend the permissible range (breakdown voltage margin) of the distance between the body layer and the drain layer at the end in the gate-width direction. This means the absence of any excessive demand for improved accuracy of ion implantation at the forming of the body layer 4, which further implies simpler manufacturing processes for the semiconductor device 100. As a result, the manufacturing costs of the semiconductor device 100 can be held down.

Moreover, the thick film portion 24 may be formed using the thermal oxidation at the forming of a gate oxide film of another device such as a high-voltage MOS transistor. Hence, in the application of the first embodiment, there is no increase in the number of manufacturing processes, and this prevents any rise in the manufacturing costs.

Second Embodiment

In a second embodiment of the present invention, the region where the thick film portion 24 is disposed differs from that of the first embodiment in which the thick film portion 24 is located in a region closer to the extreme end than the diffusion layer 8 in the end E in the gate-width direction of the gate insulator 10. The same structural components as those of the first embodiment are given the identical reference numerals and the description thereof is omitted as appropriate.

Figure 14:
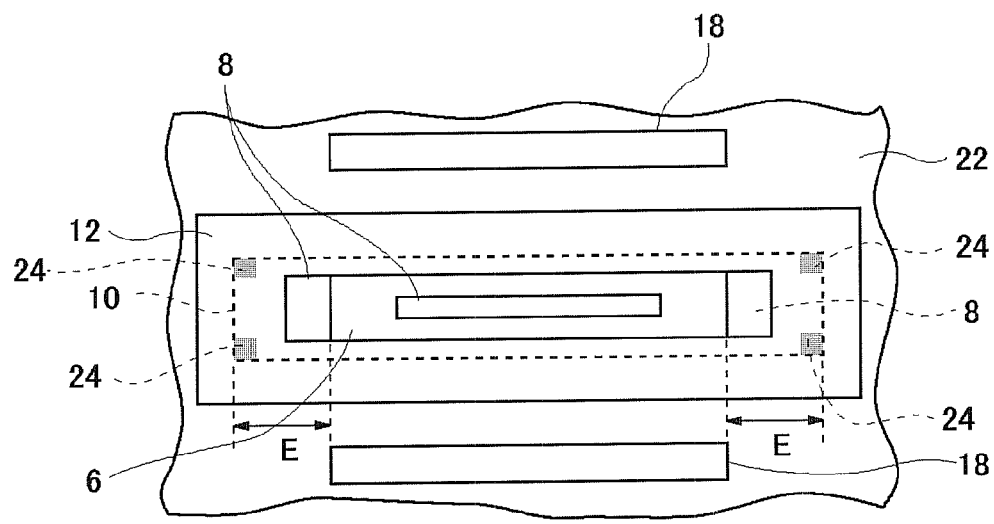
FIG. 14 is a schematic plan view of a semiconductor device according to a second embodiment of the present invention.

FIG. 14 is a schematic plan view of a semiconductor device 100 according to the second embodiment.

In the second embodiment, as shown in FIG. 14, the thick film portion 24 is located at a region of the gate insulator 10 located above the corners on the boundary surface of the body layer 4 which is in contact with the undersurface of the gate insulator 10 in the end E in the gate-width direction.

In this semiconductor device 100, the concentration of an impurity in the drift layer 14, for instance, can increase and the electric field tends to converge particularly at the corners on the boundary surface of the body layer 4 in the end E in the gate-width direction of the gate insulator 10. In the second embodiment, the convergence of an electric field is alleviated effectively by providing the thick film portion 24 in a region of the gate insulator 10 located on these corners. As a result, the high breakdown voltage characteristic of the semiconductor device 100 is improved.

Third Embodiment

In a third embodiment of the present invention, the semiconductor device 100 has the thick film portion 24 disposed in a different region from that of the first and second embodiments. The same structural components as those of the first embodiment are given the identical reference numerals and the description thereof is omitted as appropriate.

Figure 15A:
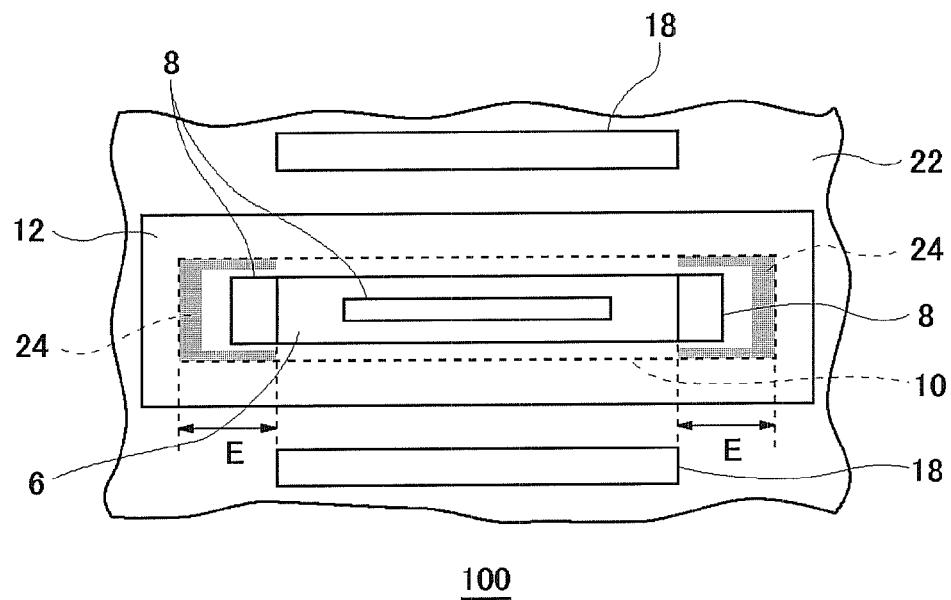
FIG. 15A is a schematic plan view of a semiconductor device according to a third embodiment of the present invention.
Figure 15B:
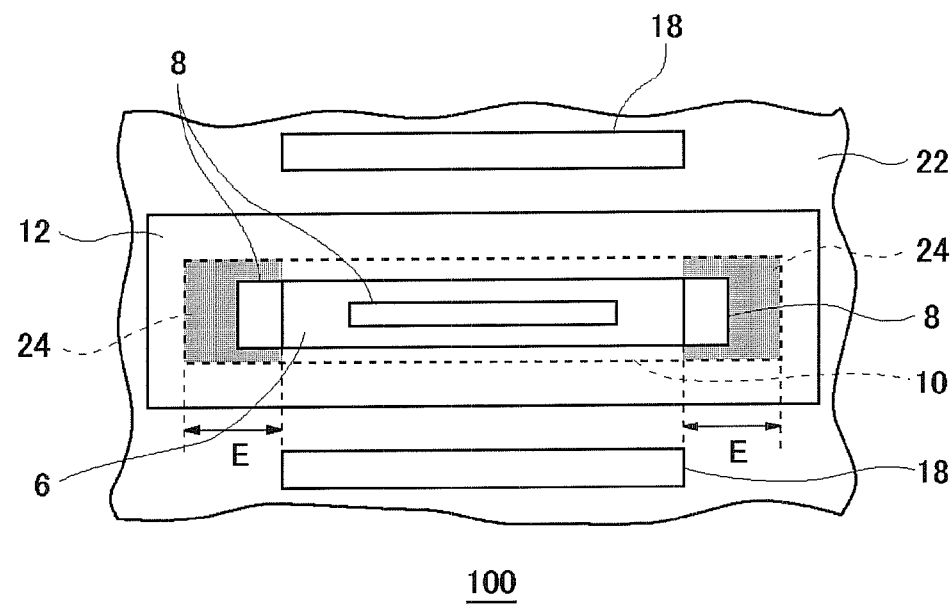
FIG. 15B is a schematic plan view of a semiconductor device according to a third embodiment of the present invention.

FIGS. 15A and 15B are schematic plan views of semiconductor devices 100 according to the third embodiment.

In the third embodiment, as shown in FIG. 15A, an approximately U-shaped thick film portion 24 is located in a region in contact with the field insulating film 22 in accordance with the boundary surface of the body layer 4 in the end E in the gate-width direction. That is, the thick film portion 24 is formed in an approximately U shape surrounding the diffusion layer 8.

Thus, the approximately U-shaped thick film portion 24 provided in the end E in the gate-width direction of the gate insulator 10 serves to alleviate the convergence of an electric field in the gate-width direction and the gate-length direction at the end E. As a result, the high breakdown voltage characteristic of the semiconductor device 100 is further improved.

It is to be noted that as shown in FIG. 15B, the thick film portion 24 may be disposed not only in a region in contact with the field insulating film 22 but also in the entirety including a region in contact with the diffusion layer 8. In this arrangement, the convergence of an electric field occurring in the end E in the gate-width direction can be alleviated more effectively. Also, the wider area of the thick film portion 24 gives a higher degree of freedom in the extent of diffusion in the body layer 4.

Fourth Embodiment

In a fourth embodiment of the present invention, the semiconductor device 100 has the thick film portion 24 disposed in a different region from those of the first to third embodiments. The same structural components as those of the first embodiment are given the identical reference numerals and the description thereof is omitted as appropriate.

Figure 16:
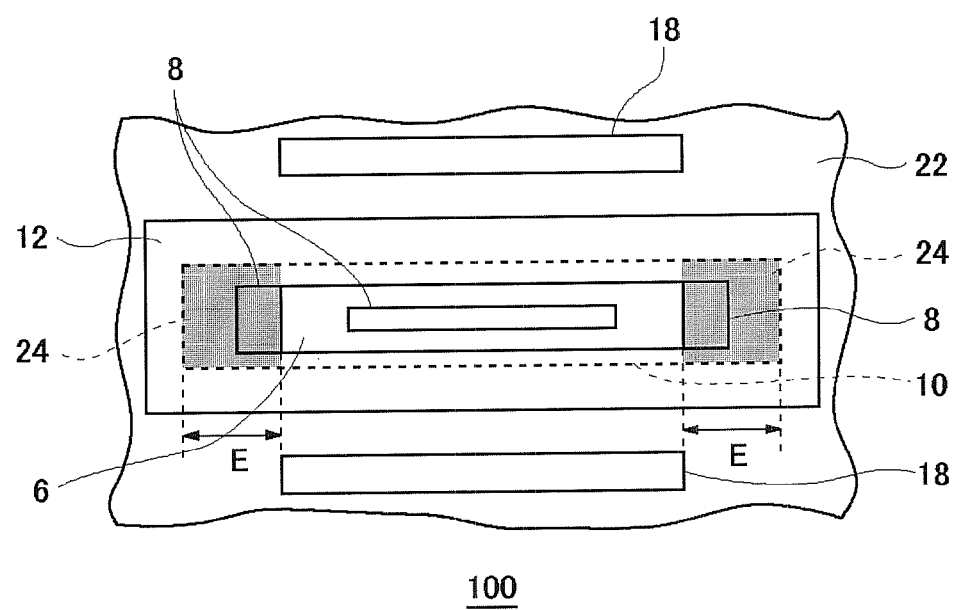
FIG. 16 is a schematic plan view of a semiconductor device according to a fourth embodiment of the present invention.

FIG. 16 is a schematic plan view of a semiconductor device 100 according to the fourth embodiment.

In the fourth embodiment, as shown in FIG. 16, the thick film portion 24 is provided in the entirety of the end E in the gate-width direction of the gate insulator 10 including the region above the diffusion layer 8.

Thus, the thick film portion 24 provided above the diffusion layer 8 residing in the end E in the gate-width direction functions as a mask in the process of forming the diffusion layer 8, which can reduce the injection volume of high-concentration P-type impurity in the epitaxial layer 3. As a result, the extent of a depletion layer between the source layer 6 and the drift layer 14 can be widened in the end E in the gate-width direction of the gate insulator 10. And this works to further improve the high breakdown voltage characteristic in the end E in the gate-width direction of the gate insulator 10, with the result that the high breakdown voltage characteristic of the semiconductor device 100 is further improved.

The present invention is not limited to the above-described embodiments only, and various modifications, such as changes in design, are possible. The embodiments added with such modifications are also within the scope of the present invention.

Figure 17:
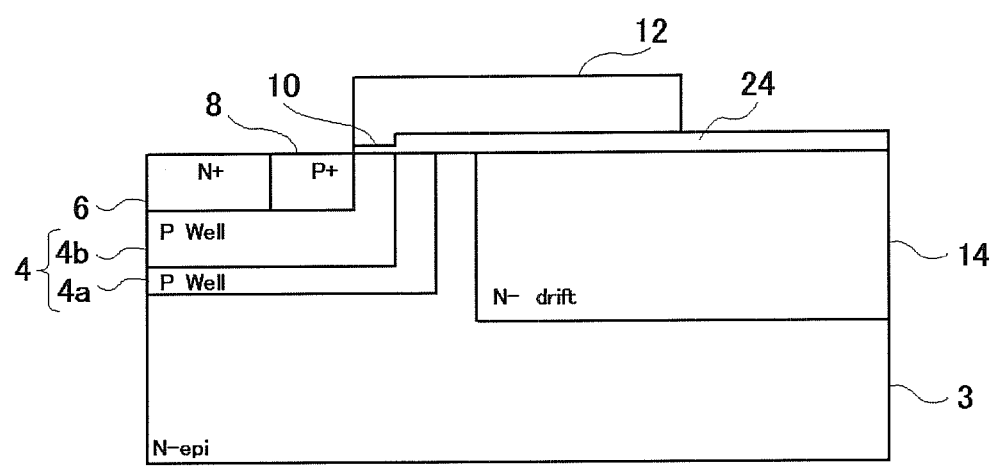
FIG. 17 is a schematic cross-sectional view, showing a semiconductor device according to a modification, taken along the line B-B of FIG. 1.

For example, as shown in FIG. 17, the arrangement may be such that the semiconductor device 100 does not have a field insulating film 22, but has a thick film portion 24 formed in the region for the field insulating film 22. In such a case, too, the same advantageous effects as those of the other above-described embodiments may be achieved due to the presence of the thick film portion 24 thicker than the part above the channel region CH in the gate-length direction at least in a part of the gate insulator 10 where the gate insulator 10 is in contact with the boundary surface of the body layer 4 at the end E in the gate-width direction. FIG. 17 is a schematic cross-sectional view showing a semiconductor device 100 according to the present modification, taken along the line B-B of FIG. 1.

While the preferred embodiments of the present invention and their modifications have been described using specific terms, such description is for illustrative purposes only, and it is to be understood that changes and variations may further be made without departing from the spirit or scope of the appended claims.

What is claimed is:

1. A semiconductor device, comprising:
    a semiconductor layer;
    a body layer, formed in a surface of said semiconductor layer, which includes a channel region therein;
    a first impurity diffusion region formed in the surface of said semiconductor layer and disposed in superposition on said body layer;
    a gate insulator formed on said semiconductor layer;
    a gate electrode formed on said semiconductor layer including a portion above the channel region through said gate insulator disposed therebetween;
    a drift layer, formed on said semiconductor layer; and
    a second impurity diffusion region formed in the surface of said semiconductor layer and disposed opposite to said first impurity diffusion region,
    wherein said body layer is disposed such that a boundary surface thereof at an end in a gate-width direction is in contact with an undersurface of said gate insulator, and
    wherein said gate insulator has a thick film portion thicker than a part above the channel region in a gate-length direction at least in a part where said gate insulator is in contact with the boundary surface of said body layer at the end in a gate-width direction.

2. A semiconductor device according to claim 1, wherein said gate electrode is formed in a ring shape surrounding said first impurity diffusion region.

3. A semiconductor device according to claim 1, wherein said gate insulator is formed in a ring shape surrounding said first impurity diffusion region.

4. A semiconductor device according to claim 1, wherein said drift layer is formed in a ring shape surrounding said body layer.

5. A semiconductor device according to claim 1, wherein the boundary surface of said body layer in contact with the undersurface of said gate insulator is approximately U-shaped, and
    wherein the thick film portion is provided at corners on the boundary surface of said body layer.

6. A semiconductor device according to claim 2 wherein the boundary surface of said body layer in contact with the undersurface of said gate insulator is approximately U-shaped, and
   wherein the thick film portion is provided at corners on the boundary surface of said body layer.

7. A semiconductor device according to claim 1, wherein the boundary surface of said body layer in contact with the undersurface of said gate insulator is approximately U-shaped, and
   wherein the thick film portion, which is approximately U-shaped, is provided in accordance with the boundary surface.

8. A semiconductor device according to claim 5, further comprising a diffusion layer formed in a surface of said semiconductor layer in superposition on said body layer in a region surrounded by the boundary surface,
   wherein the thick film portion is provided in such a manner as to extend from said body layer onto said diffusion layer.

9. A semiconductor device according to claim 1, further comprising a field insulating film which is in contact with said gate insulator at a point outside of the boundary surface,
   wherein the thick film portion is provided in a region in contact with said field insulating film at the end in a gate-width direction.

10. A semiconductor device according to claim 9, wherein said gate insulator is in contact with said field insulating film without the thick film portion disposed therebetween in the gate-length direction.

\* \* \* \* \*